United States Patent
Shishido et al.

(10) Patent No.: US 10,261,409 B2
(45) Date of Patent: Apr. 16, 2019

(54) MASK BLANK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Hiroaki Shishido, Tokyo (JP); Osamu Nozawa, Tokyo (JP)

(73) Assignee: HOYA CORPORATION, Nishi-Shinjuku, Tokyo (JP)

(*) Notice: Subject to any disclaimer, the term of this patent is extended or adjusted under 35 U.S.C. 154(b) by 0 days.

(21) Appl. No.: 15/300,376

(22) PCT Filed: Mar. 30, 2015

(86) PCT No.: PCT/JP2015/059855
§ 371 (c)(1),
(2) Date: Sep. 29, 2016

(87) PCT Pub. No.: WO2015/152124
PCT Pub. Date: Oct. 8, 2015

(65) Prior Publication Data
US 2017/0139316 A1    May 18, 2017

(30) Foreign Application Priority Data
Mar. 30, 2014 (JP) .................... 2014-070686

(51) Int. Cl.
*G03F 1/32* (2012.01)
*G03F 1/58* (2012.01)
(Continued)

(52) U.S. Cl.
CPC ............ *G03F 1/32* (2013.01); *G03F 1/58* (2013.01); *G03F 1/80* (2013.01); *H01L 21/00* (2013.01); *H01L 21/324* (2013.01)

(58) Field of Classification Search
CPC .................................. G03F 1/32; G03F 1/80
(Continued)

(56) References Cited

U.S. PATENT DOCUMENTS

2005/0019674 A1   1/2005   Okubo et al.
2007/0020534 A1   1/2007   Yoshikawa et al.
(Continued)

FOREIGN PATENT DOCUMENTS

JP     06-069185 A     3/1994
JP     2007-033470 A   2/2007
(Continued)

OTHER PUBLICATIONS

International Search Report of PCT/JP2015/059855 dated Jun. 16, 2015.

*Primary Examiner* — Timor Karimy
(74) *Attorney, Agent, or Firm* — Sughrue Mion, PLLC

(57) ABSTRACT

A mask blank, which is capable of being formed with high transfer accuracy when a hard mask film pattern is used as a mask, and even when the mask blank includes a chromium-based light shielding film. A light-semitransmissive film, a light shielding film, and a hard mask film are laminated in the stated order on a transparent substrate. The light-semitransmissive film contains silicon, and the hard mask film contains any one or both of silicon and tantalum. The light shielding film has a laminate structure of a lower layer and an upper layer, and contains chromium. The upper layer has a content of chromium of 65 at % or more, and a content of oxygen of less than 20 at %, and the lower layer has a content of chromium of less than 60 at %, and a content of oxygen of 20 at % or more.

18 Claims, 3 Drawing Sheets

(51) Int. Cl.
 *G03F 1/80* (2012.01)
 *H01L 21/324* (2006.01)
 *H01L 21/00* (2006.01)

(58) Field of Classification Search
 USPC .......................................................... 438/795
 See application file for complete search history.

(56) References Cited

U.S. PATENT DOCUMENTS

2010/0081066 A1  4/2010  Nozawa
2013/0059235 A1* 3/2013  Inazuki .................... G03F 1/14
                                               430/5
2015/0309598 A1  10/2015 Zeliff et al.

FOREIGN PATENT DOCUMENTS

| JP | 2010-079110 A | 4/2010 |
| JP | 2013-057739 A | 3/2013 |
| JP | 2013-238776 A | 11/2013 |
| WO | 2004/090635 A1 | 10/2004 |

* cited by examiner

MASK BLANK, METHOD FOR MANUFACTURING TRANSFER MASK, AND METHOD FOR MANUFACTURING SEMICONDUCTOR DEVICE

CROSS REFERENCE TO RELATED APPLICATIONS

This application is a National Stage of International Application No. PCT/JP2015/059855 filed Mar. 30, 2015, claiming priority based on Japanese Patent Application No. 2014-070686 filed Mar. 30, 2014, the contents of all of which are incorporated herein by reference in their entirety.

TECHNICAL FIELD

This invention relates to a method of manufacturing a transfer mask used in manufacturing a semiconductor device, and a mask blank used in manufacturing the transfer mask.

BACKGROUND ART

In general, in a manufacturing step of a semiconductor device, a fine pattern is formed using a photolithography method. Further, in forming the fine pattern, a large number of transfer masks (also generally called photomasks) are generally used. In a transfer mask, in general, a light shielding blocking fine pattern formed of a metal thin film or the like is provided on a transparent glass substrate. The photolithography method is also used in manufacturing this transfer mask.

The transfer mask is an original plate for transferring the same fine pattern in high volume. Therefore, the dimensional accuracy of a pattern formed on the transfer mask directly affects the dimensional accuracy of the fine pattern to be manufactured. As the degree of integration of a semiconductor circuit is improved, the dimensions of the pattern become smaller, and the accuracy of the transfer mask is required to be higher.

Hitherto, as such transfer mask, there have been well known a binary mask, in which a transfer pattern formed of a light shielding film is formed on a transparent substrate, e.g., a glass substrate, a phase shift mask, in which a transfer pattern formed of a phase shift film, or of a phase shift film and a light shielding film is formed on the transparent substrate, and other type of masks. There has also been known a halftone-type phase shift mask, in which a light shielding band is formed in a peripheral portion of a transfer pattern forming region.

For example, in WO-A-2004/090635 (Patent Document 1), there is described, as a mask blank for manufacturing a halftone-type transfer mask, a mask blank having the thin-film structure including, from a substrate side, a metal silicide-based transfer mask film (light-semitransmissive film), a light shielding film made of a chromium-based compound, and a hard mask film made of a silicon compound.

PRIOR ART DOCUMENTS

Patent Document

Patent Document 1: WO-A-2004/090635

SUMMARY OF THE INVENTION

Problem to be Solved by the Invention

When such mask blank as described in Patent Document 1 is patterned, first, the hard mask film made of the silicon compound is patterned by dry etching using a fluorine-based gas, and using as a mask a predetermined resist pattern formed on a surface of the mask blank. Next, the light shielding film made of the chromium-based compound is patterned by dry etching using a mixture gas of chlorine and oxygen, and using the patterned hard mask film as a mask. Subsequently, a metal silicide-based transfer mask film (light-semitransmissive film) is patterned by dry etching using a fluorine-based gas, and using the patterned light shielding film as a mask.

Meanwhile, when a proportion of a chromium element contained in a composition is high, the above-mentioned chromium-based light shielding film has a high extinction coefficient, and hence is advantageous in that high optical density is obtained even when a film thickness is reduced. However, when the proportion of the chromium element becomes higher, an etching rate becomes lower, and more time is required for the patterning. Therefore, there is a fear that the pattern of the hard mask film, which is above the light shielding film, may disappear before the patterning of the light shielding film is complete.

Moreover, when the light shielding film is patterned by the dry etching, at a stage in which an etching gas reaches a lower surface of the light shielding film, a surface side of the light shielding film has substantially the same space width as that of the pattern of the hard mask film, and in contrast, etching in side wall sides of the lower surface does not proceed sufficiently, with the result that the lower surface has a space width that is smaller than that of the pattern of the hard mask film, and that a cross-sectional shape of the side walls has a portion that is in an inclined state. Therefore, there is a need to perform additional etching (over etching) so that the spaces of the light shielding film pattern are formed reliably also in the lower surface.

However, when a proportion of chromium element contained in the composition of the chromium-based light shielding film is large, the etching rate is low. Therefore, in order to reliably form the spaces in the lower surface, there arises a need to perform the over etching for a long period of time. However, when the over etching is performed for the long period of time, a surface of a metal silicide-based transfer mask film, which is a layer below the light shielding film, is damaged, and hence there is a problem in that the over etching cannot be performed very long.

To the contrary, when the proportion of the chromium element contained in the composition is low, the etching rate becomes higher, but the extinction coefficient becomes lower. Therefore, in order to obtain predetermined optical density, the film thickness needs to be increased. Moreover, a film having the small proportion of chromium element has a film stress that exhibits a tendency toward compressive stress, and hence when a film thickness is increased to obtain the optical density, there is a fear that a front surface of the mask blank may be deformed under the effect of the compressive stress. The deformation of the surface of the mask blank affects positional accuracy during pattern formation.

Moreover, the mixture gas of chlorine and oxygen, which is used in the dry etching of the chromium-based light shielding film, has a property of isotropic etching. Therefore, when the etching rate is high because the chromium component is small, and the film thickness is thick, side walls of the pattern are also eroded by the etching gas. As a result, the light shielding film pattern becomes thinner than that of the hard mask film pattern, which is above the light shielding film pattern, and pattern accuracy of the transfer mask film, which is formed by the patterning using the light shielding film pattern as the mask, is deteriorated.

As a countermeasure, there is known a method in which the resist pattern is formed to have large dimensions at line portions thereof and small dimensions at space portions thereof in consideration of thinning of the light shielding film pattern. However, when the width dimension of the spaces of the resist pattern is small, there is also a problem in that development for the formation of the spaces becomes more difficult.

This invention has been made in view of the above-mentioned problems in the relate art, and therefore has the following objects; firstly, to provide a mask blank, which is capable of being formed with high transfer accuracy when a hard mask film pattern is used as a mask, and even when the mask blank includes a chromium-based light shielding film; secondly, to provide a method of manufacturing a transfer mask in which the fine pattern is formed with high accuracy using such mask blank; and thirdly, to provide a method of manufacturing a high-quality semiconductor device with excellent pattern accuracy using such transfer mask.

Means to Solve the Problem

The inventors of this invention have devised this invention based on findings obtained as a result of conducting, on a mask blank having the structure in which a light-semitransmissive film, a light shielding film, and a hard mask film are laminated in the stated order on a transparent substrate, intense research in which the above-mentioned light shielding film has a predetermined laminated structure, focusing attention on side etching amounts in dry etching using a mixture gas of a chlorine gas and an oxygen gas in respective layers of the light shielding film.

Specifically, in order to solve the problems described above, this invention has the following configuration.

(Configuration 1)

A mask blank having a structure in which a light-semitransmissive film, a light shielding film, and a hard mask film are laminated in the stated order on a transparent substrate, the light-semitransmissive film at least containing silicon, the hard mask film being formed in contact with a surface of the light shielding film, and at least containing any one or both of silicon and tantalum, the light shielding film having a laminated structure of a lower layer and an upper layer, and at least containing chromium, the upper layer having a content of the chromium of 65 at % or more, and a content of oxygen of less than 20 at %, the lower layer having a content of the chromium of less than 60 at %, and a content of oxygen of 20 at % or more.

According to Configuration 1, the upper layer of the light shielding film containing chromium, which is immediately below the hard mask film, has a high content of chromium (is chromium-rich) and a low content of oxygen, with the result that the etching rate is low, and side etching during the etching is less likely to occur (side walls of the pattern are less likely to be eroded). With the side etching in the upper layer of the light shielding film being less likely to occur, a pattern shape of the hard mask film, which is immediately above the upper layer of the light shielding film, is transferred substantially accurately to the upper layer. With the light shielding film including the upper layer, to which the pattern shape of the hard mask film has been transferred substantially accurately, the pattern of the hard mask film can also be formed substantially accurately in the light-semitransmissive film containing silicon, which is patterned by a fluorine-based gas being an anisotropic etching gas using the pattern of the light shielding film as the mask.

Moreover, according to Configuration 1, there are also obtained effects of reducing the film stresses of thin films formed into the mask blank, and of suppressing the deformation of the surface of the mask blank.

A silicon-based compound adopted for the light-semitransmissive film in Configuration 1 is less susceptible to damages of the films due to heating processing and the like, and hence processing of heating up to 300° C. or more can be performed. A metal silicide-based thin film formed by the sputtering can reduce a film stress to a negligible degree by the above-mentioned heating processing. Meanwhile, a chromium-based thin film is significantly changed in film quality when high-temperature processing is performed after the film formation, and hence is not positively subjected to the high-temperature processing. Therefore, the chromium-based thin film is difficult to reduce the film stress by post treatment such as heat treatment after sputter deposition. Further, when a hard mask film made of a silicon-based thin film or a tantalum-based thin film is formed after the chromium thin film is formed, the silicon-based thin film or the tantalum-based thin film cannot be heated after the formation, and hence it is difficult to reduce film stresses thereof.

The film stress of the chromium-based thin film exhibits a tendency toward weak compressive stress when the proportion of chromium element is small. As the proportion of chromium element becomes larger, the compressive stress becomes gradually weaker. Further, the film stress exhibits a tendency toward strong tensile stress when the proportion of chromium element is increased. Configuration 1 relates to a mask blank in which an upper layer, which has a large proportion of chromium element and hence a stress tendency that is a tendency toward tensile stress, is formed on a lower layer, which has a small proportion of chromium element and hence a tendency toward compressive stress. Therefore, according to Configuration 1, the chromium-based thin film, which has the small proportion of chromium element having the tendency toward compressive stress, can be reduced in thickness, and hence imbalance in total film stress of the light shielding film can be reduced. Further, the silicon-based thin film exhibits a compressive stress without annealing. Therefore, a layer having a large proportion of chromium element, which imparts a tendency toward tensile stress, can be included in the light shielding film to reduce the total film stress of the thin films formed on the substrate. As a result, the deformation of the surface of the mask blank can also be effectively suppressed, and a pattern having an excellent positional accuracy can be formed.

Moreover, the lower layer of the light shielding film has a content of chromium that is lower than that of the upper layer, and a content of oxygen that is higher than that of the upper layer. As a result, there is adopted a film design in which the lower layer has a high etching rate, and hence the etching rate of the light shielding film as a whole can be increased. Consequently, the patterning of the light shielding film can be completed without a disappearance of the pattern in the hard mask film.

As described above, according to Configuration 1, even such fine transfer pattern can be formed in the light-semitransmissive film, which functions as the transfer mask film of the mask blank according to this invention, with high accuracy, and as a result, the transfer mask with excellent pattern accuracy can be manufactured.

(Configuration 2)

The mask blank according to Configuration 1, wherein the lower layer has a content of the chromium of 40 at % or more.

According to Configuration 1, the content of chromium in the lower layer of the light shielding film is less than 60 at %. However, when the content of chromium is too low, an extinction coefficient k with respect to, for example, an ArF excimer laser light (wavelength: 193 nm) is low, and hence there arises a need to increase the film thickness of the light shielding film (especially the lower layer) to obtain the predetermined optical density. To address this problem, as in Configuration 2, the content of chromium in the lower layer is set to 40 at % or more such that the above-mentioned extinction coefficient k is increased. As a result, the light shielding film can be reduced in thickness, and accuracy of patterning the light-semitransmissive film using the pattern of the light shielding film as the mask can be increased.

(Configuration 3)

The mask blank according to Configuration 1 or 2, wherein the lower layer has a content of the oxygen of 30 at % or less.

According to Configuration 1, the lower layer of the light shielding film has the content of oxygen of 20 at % or more, but it is preferred that the lower layer have the content of oxygen of 30 at % or less as in Configuration 3. When the content of oxygen of the lower layer becomes higher than 30 at %, the etching rate of the lower layer is increased, but progress of side etching in the lower layer portion is also increased in speed, with the result that a clear step may be formed at a boundary between the upper layer and the lower layer in the cross section of the pattern. With such step, when a finer pattern is to be formed, there is a fear that the light shielding film pattern may fall.

As in this Configuration, when the content of oxygen of the lower layer is in the above-mentioned range, the etching rate of the lower layer is kept high. As a result, the etching rate of the entire light shielding film can also be kept high, and the effect of the side etching in the lower layer portion can be suppressed.

Moreover, when the content of oxygen contained in the lower layer is in the above-mentioned range, there can also be obtained the effect of further enhancing adhesion between the light shielding film pattern and the light-semitransmissive film. This is because, at an interface between the light shielding film and the light-semitransmissive film, oxygen elements are moved and connected by chemical bonds.

(Configuration 4)

The mask blank according to any one of Configurations 1 to 3, wherein the lower layer is dry-etched using a mixture gas of a chlorine gas and an oxygen gas at an etching rate that is three times an etching rate at which the upper layer is dry-etched using the mixture gas of the chlorine gas and the oxygen gas or more.

As in Configuration 4, with the lower layer of the light shielding film being dry-etched using the mixture gas of the chlorine gas and the oxygen gas at the etching rate that is three times the etching rate of the upper layer or more, the etching rate in the depth direction is increased when the etching proceeds from the upper layer to the lower layer, and the etching in the depth direction of the lower layer can be completed while suppressing the progress of the side etching in the upper layer.

(Configuration 5)

The mask blank according to any one of Configurations 1 to 4, wherein the lower layer has a structure in which a bottom layer and an intermediate layer are laminated in the stated order from the light-semitransmissive film side.

As in Configuration 5, with the lower layer having the structure in which the bottom layer and the intermediate layer are laminated in the stated order from the light-semitransmissive film side, the intermediate layer is formed between the upper layer and the bottom layer of the light shielding film so that the light shielding film has the three-layer structure. As a result, the contents of chromium in the respective layers can be adjusted to control, for example, the etching rate of the light shielding film in three stages to thereby suppress the formation of the step due to the difference in degree of progress of the side etching in the side walls of the pattern of the light shielding film, and to thereby improve the cross-sectional shape of the pattern of the light shielding film as compared to the light shielding film having the two-layer structure.

(Configuration 6)

The mask blank according to Configuration 5, wherein the bottom layer is dry-etched using a mixture gas of a chlorine gas and an oxygen gas at an etching rate that is three times an etching rate at which the upper layer is dry-etched using the mixture gas of the chlorine gas and the oxygen gas or more.

As in Configuration 6, with the bottom layer of the light shielding film having the three-layer laminated structure being dry-etched using the mixture gas of the chlorine gas and the oxygen gas at the etching rate that is three times the etching rate of the upper layer or more, the side wall portion of the pattern in the upper layer is hardly etched during the etching of the bottom layer, and the etching in the depth direction of the bottom layer can be completed while suppressing the progress of the side etching of the upper layer.

(Configuration 7)

The mask blank according to Configuration 5 or 6, wherein the bottom layer is dry-etched using a mixture gas of a chlorine gas and an oxygen gas at an etching rate that is higher than and two times an etching rate at which the intermediate layer is dry-etched using the mixture gas of the chlorine gas and the oxygen gas or less.

In a case where an etching rate in the bottom layer is relatively higher than that in the intermediate layer, when the etching proceeds from the intermediate layer to the bottom layer, the etching rate in the depth direction is increased. As in Configuration 7, with the etching rate of the bottom layer being two times the etching rate of the intermediate layer or less in the etching in the bottom layer and over etching necessary for reliably forming a space portion of the pattern are completed during the etching of the bottom layer before the side etching proceeds more in the intermediate layer, and hence formation of a step can be suppressed especially at the interface of the side walls of the pattern between the intermediate layer and the bottom layer.

Moreover, it is preferred that the etching rate of the bottom layer be high because the time for over etching can be reduced. Meanwhile, when the etching rate of the bottom layer is too high, the side wall portion of the pattern is deeply eroded by the etching gas in the bottom layer portion, and there is a risk of reducing a contact area between the light-semitransmissive film and the light shielding film pattern. When the etching rate of the bottom layer is in the above-mentioned range, the erosion of the side walls of the pattern in the bottom layer can also be suppressed while reducing the time for over etching.

(Configuration 8)

The mask blank according to any one of Configurations 1 to 7, wherein the upper layer has a thickness of 1.5 nm or more and 8 nm or less.

As in Configuration 8, with the upper layer of the light shielding film having the thickness in a range of 1.5 nm or more and 8 nm or less, the good patterning accuracy for the upper layer can be maintained while satisfactorily suppressing the etching time of the upper layer. A preferred thickness of the upper layer is 3 nm or more and 8 nm or less.

(Configuration 9)

The mask blank according to any one of Configurations 1 to 8, wherein the light shielding film has a thickness of 35 nm or more and 55 nm or less.

As in Configuration 9, with the light shielding film having the thickness of 35 nm or more and 55 nm or less, the thickness of the entire light shielding film can be reduced, and the accuracy of patterning the light-semitransmissive film using the pattern of the light shielding film as the mask can be increased.

(Configuration 10)

The mask blank according to any one of Configurations 1 to 9, wherein the hard mask film contains oxygen.

The hard mask film needs to be made of a material having high etching selectivity with respect to the light shielding film, which is immediately below the hard mask film. As in Configuration 10, a material containing an oxide in addition to silicon or tantalum can be selected for the hard mask film to secure the high etching selectivity with respect to the light shielding film, which is made of a chromium-based material, and not only a resist but also the hard mask film can be reduced in thickness. Therefore, accuracy of transferring the resist pattern formed in the surface of the mask blank is improved, thereby being capable of forming a pattern with excellent pattern accuracy in the light shielding film.

(Configuration 11)

The mask blank according to any one of Configurations 1 to 10, wherein the light-semitransmissive film contains silicon and nitrogen.

As in Configuration 11, a material containing silicon and nitrogen can be applied to the light-semitransmissive film to secure etching selectivity with respect to the light shielding film, which is made of the chromium-based material. Moreover, when the material containing silicon and nitrogen is used, patterning using an anisotropic fluorine-based gas as an etching gas can be applied. Therefore, the light shielding film pattern, to which the pattern shape of the hard mask film has been transferred substantially accurately, can be used as the mask to also form a pattern having excellent pattern accuracy in the light-semitransmissive film.

(Configuration 12)

The mask blank according to any one of Configurations 1 to 11, wherein the light-semitransmissive film and the light shielding film form a laminated structure having a transmittance of 0.2% or less with respect to an ArF excimer laser light (wavelength: 193 nm).

As in Configuration 12, the laminated structure of the light-semitransmissive film and the light shielding film has a transmittance of 0.2% or less with respect to the ArF excimer laser light (wavelength: 193 nm). Thus, the laminated structure can have good light shielding property (optical density of 2.7 or more) with respect to the ArF excimer laser light as the exposure light in a preferred manner.

(Configuration 13)

The mask blank according to any one of Configurations 1 to 12, wherein the light-semitransmissive film and the light shielding film form a laminated structure having a transmittance of 50% or less with respect to light having a wavelength in at least a part of a wavelength region of from 800 nm to 900 nm.

The resist is not sensitive to light in a near-infrared region having a wavelength of from 800 nm to 900 nm, and hence the light is used for alignment when the mask blank is placed in an exposure apparatus. As in Configuration 13, the laminated structure of the light-semitransmissive film and the light shielding film has a transmittance of 50% or less with respect to light having a wavelength in at least a part of the wavelength region of from 800 nm to 900 nm. Thus, the laminated structure enables easy placement of the mask blank in the exposure apparatus in a preferred manner.

(Configuration 14)

The mask blank according to any one of Configurations 1 to 13, wherein the hard mask film and the light-semitransmissive film are patterned by dry etching using a fluorine-based gas.

According to Configuration 14, the hard mask film and the light-semitransmissive film are patterned by the dry etching using the anisotropic fluorine-based gas. Consequently, together with the substantially accurate transfer of the pattern shape of the hard mask film, which is immediately above the upper layer of the light shielding film, to the upper layer, the transfer pattern can be formed with excellent form accuracy of the pattern in the light-semitransmissive film by the patterning using the light shielding film as the mask.

(Configuration 15)

A method of manufacturing a transfer mask using the mask blank of any one of Configurations 1 to 14, the method comprising the steps of: forming a light-semitransmissive film pattern in the hard mask film by dry etching using a fluorine-based gas and using as a mask a resist film, which is formed on the hard mask film and has the light-semitransmissive film pattern; forming the light-semitransmissive film pattern in the light shielding film by dry etching using a mixture gas of a chlorine gas and an oxygen gas, and using as a mask the hard mask film, in which the light-semitransmissive film pattern has been formed; forming the light-semitransmissive film pattern in the light-semitransmissive film by dry etching using a fluorine-based gas and using as a mask the light shielding film, in which the light-semitransmissive film pattern has been formed; and forming a light shielding pattern in the light shielding film by dry etching using a mixture gas of a chlorine gas and an oxygen gas, and using as a mask a resist film, which is formed on the light shielding film and has a light shielding pattern.

As in Configuration 15, the transfer mask can be manufactured following the above-mentioned manufacturing steps and using the mask blank according to this invention to obtain the transfer mask in which a fine pattern being, for example, less than 80 nm is formed with high accuracy.

(Configuration 16)

A method of manufacturing a semiconductor device, comprising a step of patterning and transferring a transfer pattern of a transfer mask, which is manufactured by the method of manufacturing a transfer mask of Configuration 15, on a semiconductor substrate by a lithography method using the transfer mask.

As in Configuration 16, a high-quality semiconductor device can be obtained with excellent pattern accuracy using the transfer mask in which the above-mentioned fine pattern is formed with high accuracy.

Effect of the Invention

According to the mask blank of this invention, even the fine transfer pattern can be formed with high accuracy. More specifically, according to the mask blank of this invention, the upper layer of the light shielding film has the high content of chromium (is chromium-rich) and the low content of oxygen, and hence has the low etching rate, with the result that the upper layer pattern is less susceptible to the side etching. Therefore, there can be formed the light shielding film pattern to which the shape of the transfer pattern, which is formed in the resist film or the hard mask film, is transferred substantially accurately. As a result, when the light-semitransmissive film is patterned using the light shielding film pattern as the mask, the transfer pattern having the excellent pattern accuracy can be formed in the light-semitransmissive film. Moreover, the lower layer of the light shielding film has the high etching rate, and hence can increase the etching rate of the entire light shielding film, with the result that the formation of the light shielding film pattern can be completed reliably before the hard mask film pattern disappears.

Moreover, the transfer mask in which the fine pattern is formed with high accuracy can be manufactured using the above-mentioned mask blank according to this invention.

Further, the high-quality semiconductor device having the excellent pattern accuracy can be manufactured using the above-mentioned transfer mask.

MODES FOR EMBODYING THE INVENTION

Now, embodiments of this invention will be described in detail with reference to the drawings.

As described above, as a result of conducting, on a mask blank having the structure in which a light-semitransmissive film, a light shielding film, and a hard mask film are laminated in the stated order on a transparent substrate, intense research in which the light shielding film has the predetermined laminated structure, focusing attention on side etching amounts in dry etching using a mixture gas of a chlorine gas and an oxygen gas in the respective layers of the light shielding film, the inventors of this invention have found that the above-mentioned problems can be solved by this invention having the following configurations.

That is, as Configuration 1 described above, this invention is a mask blank having a structure in which a light-semitransmissive film, a light shielding film, and a hard mask film are laminated in the stated order on a transparent substrate, the light-semitransmissive film at least containing silicon, the hard mask film being formed in contact with a surface of the light shielding film, and at least containing any one or both of silicon and tantalum, the light shielding film having a laminated structure of a lower layer and an upper layer, and at least containing chromium, the upper layer having a content of the chromium of 65 at % or more, and a content of oxygen of less than 20 at %, the lower layer having a content of the chromium of less than 60 at %, and a content of oxygen of 20 at % or more.

Figure 1:
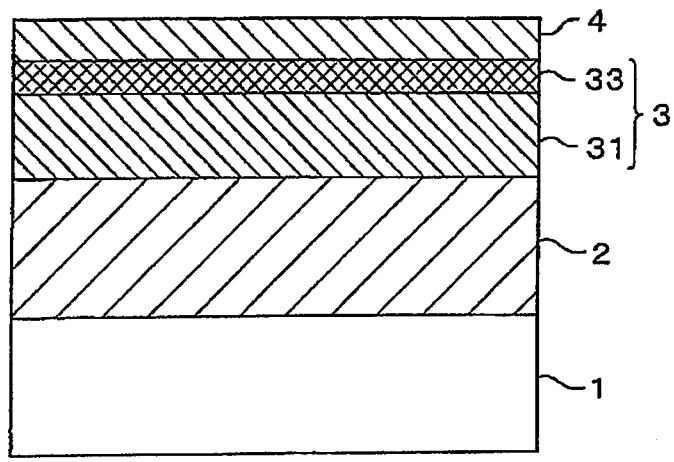
FIG. 1 is a schematic cross-sectional view of a mask blank according to a first embodiment of this invention.

FIG. 1 is a schematic cross-sectional view of a mask blank according to a first embodiment of this invention.

As illustrated in FIG. 1, a mask blank 10 according to a first embodiment of this invention has the structure in which a light-semitransmissive film 2, a light shielding film 3, and a hard mask film 4 are laminated in the stated order on a transparent substrate 1. Moreover, the light shielding film 3 has a laminated structure of a lower layer 31 and an upper layer 33.

In the mask blank 10, the light-semitransmissive film 2 at least contains silicon, and the hard mask film 4 contains any one or both of silicon and tantalum. Moreover, the light shielding film 3 having the laminated structure at least contains chromium. Note that, although details are to be described below, it is particularly preferred to apply a material containing silicon and nitrogen to the light-semitransmissive film 2, and it is particularly preferred to apply a material containing oxygen in addition to silicon or tantalum to the hard mask film 4.

Here, the transparent substrate 1 in the mask blank 10 is not particularly limited as long as being a substrate used in a transfer mask for manufacturing a semiconductor device. When used in a blank for a phase shift type mask, the transparent substrate is not particularly limited as long as being a substrate having transparency with respect to an exposure wavelength to be used, and a synthetic quartz substrate and other such glass substrates (for example, soda-lime glass, aluminosilicate glass, and other type of glass) are used. Among others, the synthetic quartz substrate has high transparency in a region of ArF excimer laser (wavelength: 193 nm) or lower wavelength, which is effective in forming a fine pattern, and hence is used particularly preferably.

A material containing silicon (Si) or a material containing tantalum (Ta) can be used as such hard mask film 4. An example of the material containing silicon (Si), which is suitable for the hard mask film 4, is a material containing silicon (Si) and one or more elements selected from oxygen (O), nitrogen (N), carbon (C), boron (B), and hydrogen (H). Another example of the material containing silicon (Si), which is suitable for the hard mask film 4, is a material containing silicon (Si), a transition metal, and one or more elements selected from oxygen (O), nitrogen (N), carbon (C), boron (B), and hydrogen (H). In addition, examples of the transition metal include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), and tin (Sn).

When a thin film containing oxygen (O) in addition to silicon (Si) is formed by a sputtering method, the thin film has a tendency toward compressive stress. In order to reduce the stress, it is effective to perform heat treatment (annealing) as a post treatment after the film formation. However, in this embodiment, the thin film is formed on the surface of the light shielding film 3 made of the chromium-based material, and hence heat treatment at 300° C. or more, for example, cannot be performed. This is because there is a fear that the light shielding film 3 made of the chromium-based material may be damaged by the heat treatment.

The tendency toward compressive stress is relatively strong, and, for example, when a 1.5 nm SiON film is directly formed on a surface of a synthetic quartz glass substrate (152 mm by 152 mm, thickness: 6 mm) for a mask blank by reactive sputtering, the SiON film has such tensile stress as to deform a shape of a surface of the substrate into a convex shape with a deformation amount of about 30 nm. The hard mask film 4 has a thickness of at least 1.5 nm, and hence as the thickness becomes larger, the deformation amount becomes larger.

Meanwhile, a chromium-based thin film exhibits a tendency toward compressive stress when the proportion of chromium element is small, but exhibits a tendency toward stronger tensile stress as the proportion of chromium element becomes higher. In this embodiment, the light shielding film 3 has the structure in which the lower layer 31, which has a low ratio of chromium element, and the upper layer 33, which has a high ratio of chromium element, are laminated. The upper layer 33 having the high ratio of chromium element has the tendency toward strong tensile stress, and hence the total film stress of the light shielding film exhibits the tendency toward tensile stress. For example, when the light shielding film 3 having a film configuration in which a film thickness of the upper layer 31, which has the large tensile stress, is the smallest, and in which a film thickness of the lower layer, which has the compressive stress, is the largest, and having a total film thickness of 55 nm is directly formed on a synthetic quartz glass substrate (152 mm by 152 mm, thickness: 6 mm) for a mask blank, the light shielding film 3 has such tensile stress as to deform a shape of a surface of the substrate into a concave shape with a deformation amount of 30 nm in depth. A total stress is varied depending on respective proportions of chromium element and respective film thicknesses, but when this embodiment is adopted, the light shielding film 3 has a tensile stress with at least a deformation amount on the above-mentioned order. When the upper layer 31 is increased in thickness and the lower layer 33 is reduced in thickness for the purpose of preventing the side etching, the light shielding film 3 has an even stronger tendency toward tensile stress, and the deformation amount is increased.

In this embodiment, when the silicon (Si)-based material is used for the hard mask film 4, the film configuration, composition, film thickness, and the like of each of the hard mask film 4 and the light shielding film 3 may be adjusted to cancel the respective stresses between the hard mask film 4 and the light shielding film 3. As a result, the total film stress of the thin films on the mask blank may be minimized. In other words, when the hard mask film 4 made of the silicon (Si)-based material is applied, there may be obtained a mask blank having a flatter surface shape. With the use of the mask blank having such surface shape, a pattern having excellent positional accuracy may be formed.

Meanwhile, an example of the material containing tantalum (Ta), which is suitable for hard mask film 4, is a material containing tantalum (Ta) and one or more elements selected from oxygen (O), nitrogen (N), carbon (C), boron (B), and hydrogen (H). Of those, a material containing tantalum (Ta) and oxygen (O) is particularly preferred. Specific examples of such material include tantalum oxide (TaO), tantalum oxynitride (TaON), tantalum borate (TaBO), and tantalum boron oxynitride (TaBON).

Such hard mask film 4 has sufficient etching selectivity with respect to the light shielding film 3, which is formed of a material containing chromium (Cr), and the hard mask film 4 may be removed by etching while hardly damaging the light shielding film 3.

The film thickness of the hard mask film 4 does not need to be particularly restricted, but is required to have at least such film thickness as not to disappear before the etching of the light shielding film 3, which is immediately below the hard mask film 4, is complete. Meanwhile, when the film thickness of the hard mask film 4 is thick, it is difficult to reduce the thickness of the resist pattern, which is immediately above the hard mask film 4. From such viewpoints, in this embodiment, the film thickness of the hard mask film 4 is preferably in a range of 1.5 nm or more and 20 nm or less, and particularly preferably 2.5 nm or more and 6 nm or less.

The light-semitransmissive film 2 is formed of a material at least containing silicon, but a configuration of the light-semitransmissive film 2 that is applicable to this invention does not need to be particularly limited, and there may be applied a configuration of a light-semitransmissive film of a phase shift type mask that has hitherto been used, for example.

Preferred examples of such light-semitransmissive film 2 include, for example, a metal silicide-based light-semitransmissive film made of a transition metal and silicon, a metal silicide-based light-semitransmissive film made of a transition metal, silicon, and a material containing one or more elements selected from oxygen, nitrogen, and carbon, and a silicon-based light-semitransmissive film made of silicon and a material containing oxygen, nitrogen, carbon, boron, and the like. Examples of the transition metal contained in the above-mentioned metal silicide-based light-semitransmissive film include molybdenum, tantalum, tungsten, titanium, chromium, nickel, vanadium, zirconium, ruthenium, and rhodium. Of those, molybdenum is particularly suitable.

As the above-mentioned material containing a transition metal and silicon, specifically, a transition metal silicide, or a material containing a nitride, oxide, carbide, oxynitride, carbonate, or carbon oxynitride of a transition metal silicide is suitable. In addition, as the above-mentioned material containing silicon, specifically, a material containing a nitride, oxide, carbide, oxynitride (oxide nitride), carbonate (carbide oxide), or carbon oxynitride (carbide oxide nitride) of silicon is suitable.

Moreover, in this invention, the light-semitransmissive film 2 may be applied to any one of a single-layer structure, or a laminated structure formed of a low-transmittance layer and a high-transmittance layer.

It is desired that a preferred film thickness of the light-semitransmissive film 2 be appropriately adjusted in view of a phase shift function and light transmittance, in particular, depending on the material. In general, the film thickness is in a range of preferably 100 nm or less, and more preferably 80 nm or less.

Moreover, the light shielding film 3 having the above-mentioned laminated structure is formed of a material containing chromium.

Examples of the above-mentioned material containing chromium include, for example, Cr simple substance or Cr compounds, e.g., CrX such as CrN, CrC, CrO, CrON, CrCN, CrOC, and CrOCN, where X represents at least one kind selected from N, C, O, and the like.

A method of forming a thin film made of a laminate film, in which the light-semitransmissive film 2, the light shielding film 3, and the hard mask film 4 are laminated in the stated order, on the transparent substrate 1, e.g., the mask blank 10 illustrated in FIG. 1, does not need to be particularly limited, but a preferred example includes, among others, a sputter deposition method. The sputter deposition method is preferred because a uniform film having a constant film thickness may be formed.

In the mask blank 10 according to the first embodiment of this invention, as described above in Configuration 1, the light shielding film 3 has the laminated structure of the lower layer 31 and the upper layer 33, and at least contains chromium. The light shielding film 3 has the features that the upper layer 33 has a content of chromium of 65 at % or more, and a content of oxygen of less than 20 at %, and that the lower layer 31 has a content of chromium of less than 60 at %, and a content of oxygen of 20 at % or more.

As described above, the upper layer 33 of the light shielding film 3 containing chromium, which is immediately below the hard mask film 4, has the content of chromium of 65 at % or more, and the content of oxygen of less than 20 at %. In other words, the upper layer 33 has a high content of chromium (is chromium-rich) and a low content of oxygen. As a result, the upper layer 33 is dry-etched using the mixture gas of the chlorine gas and the oxygen gas at a low etching rate (hereinafter sometimes simply referred to as "etching rate" for convenience of the description, but means the etching rate of the dry etching using the mixture gas of the chlorine gas and the oxygen gas), and is hardly susceptible to the side etching during the etching (in other words, the side walls of the pattern are hardly eroded). The upper layer 33 portion of the light shielding film 3 is hardly susceptible to the side etching, and hence the pattern shape of the hard mask film 4, which is immediately above the upper layer 33 of the light shielding film 3, is transferred to the upper layer 33 substantially accurately. With the resist film to be formed on the surface of the mask blank 10 being reduced in thickness, the resist pattern having the transfer pattern to be eventually formed in the light-semitransmissive film 2 is transferred correctly to the hard mask film 4, and hence the pattern shape of the hard mask film 4 is transferred to the upper layer 33 substantially accurately. With the light shielding film 3 including the upper layer 33 having little difference from the pattern shape (for example, pattern dimension) formed in the resist film, the pattern of the hard mask film 4 may also be formed substantially accurately in the light-semitransmissive film 2 containing silicon, which is patterned by anisotropic etching using the pattern of the light shielding film 3 as the mask. In short, the pattern of the light-semitransmissive film 2 may be formed without a divergence in dimension from the resist pattern or the hard mask film pattern, and hence the accuracy of the pattern to be formed in the light-semitransmissive film 2 may be increased.

Meanwhile, the lower layer 31 of the light shielding film 3 has the content of chromium of less than 60 at %, and the content of oxygen of 20 at % or more as described above. In other words, the lower layer 31 has the content of chromium that is lower than that of the upper layer 33, and has the content of oxygen that is higher than that of the upper layer 33. Therefore, there is adopted the film design in which the lower layer 31 of the light shielding film 3 has the etching rate that is higher than that of the upper layer 33, and hence the etching rate of the light shielding film 3 as a whole may be increased. It is preferred that the lower layer 31 have a film thickness of from 70% to 97% of the total film thickness of the light shielding film 3. When the film thickness of the lower layer 31 is too thin, the effect of increasing the etching rate of the entire light shielding film 3 is reduced. When the film thickness is too thick, there is a fear that the lower layer 31 is side-etched too deeply.

The lower layer 31 may have a graded composition with different contents of chromium and oxygen in a film thickness direction thereof.

As described above, in the mask blank 10 of this embodiment, the light shielding film 3 is provided for the purpose of transferring the pattern of the hard mask film 4 to the light-semitransmissive film 2 as closely as possible. In the transfer mask, that is, the phase shift type mask manufactured using the mask blank 10, the final transfer pattern is the pattern formed in the light-semitransmissive film 2, and the pattern formed in the light shielding film 3 does not function as the transfer pattern, and hence the cross-sectional shape of the light shielding film pattern itself is not quite important. In the cross-sectional shape of the pattern of the light shielding film 3, even when there is some erosion in the side walls due to the side etching in the lower layer 31 portion, as described above, the light shielding film 3 having the above-mentioned laminated structure according to this invention may transfer the pattern of the hard mask film 4 to the light-semitransmissive film 2 as closely as possible, and hence there is no problem in the cross-sectional shape of the light shielding film 3.

According to this embodiment, even the fine transfer pattern having the pattern dimension of less than 80 nm may be formed in the light-semitransmissive film as the transfer mask film with high accuracy, and as a result, the transfer mask with excellent pattern accuracy may be manufactured.

In the light shielding film 3, it is preferred that the lower layer 31 have a content of chromium of 40 at % or more (invention in Configuration 2), According to Configuration 1, the content of chromium in the lower layer 31 of the light shielding film 3 is less than 60 at %. However, when the content of chromium is too low in the lower layer 31, the extinction coefficient k with respect to, for example, the ArF excimer laser light (wavelength: 193 nm) is low, and hence there arises a need to increase the film thickness of the light shielding film 3 (especially the lower layer 31) to obtain the predetermined optical density. To address this problem, the content of chromium in the lower layer 31 is set to 40 at % or more such that the above-mentioned extinction coefficient k is increased. Consequently, the entire light shielding film 3 may be reduced in thickness, and as a result, accuracy of patterning the light-semitransmissive film 2 using the pattern of the light shielding film 3 as a mask may be increased.

From the above description, the lower layer 31 of the light shielding film 3 has the content of chromium of preferably 40 at % or more and less than 60 at %, and particularly preferably 45 at % or more and less than 57 at %.

Moreover, in the light shielding film 3, it is preferred that the lower layer 31 have a content of oxygen of 30 at % or less (invention in Configuration 3).

According to Configuration 1, the lower layer 31 of the light shielding film 3 has the content of oxygen of 20 at % or more. When the content of oxygen in the lower layer 31 is too high, the etching rate becomes much higher, and there arises a problem in that a step is formed at a boundary between the upper layer 33 and the lower layer 31 in the side walls of the pattern. Therefore, it is preferred that the lower layer 31 have the content of oxygen of 30 at % or less. When the lower layer 31 has the content of oxygen in the above-mentioned range, the etching rate of the lower layer 31 becomes even higher, and hence the etching rate of the entire light shielding film 3 may be kept high. Moreover, when the content of oxygen contained in the lower layer 31 is in the above-mentioned range, the lower layer 31 has a relatively large number of dangling bond sites (holes) of chromium, and hence the dangling sites of chromium and oxygen in the light-semitransmissive film 2 are connected by chemical bonds. As a result, there may also be obtained the effect of increasing adhesion between the light shielding film pattern and the light-semitransmissive film 2. In this manner, when the adhesion between the light shielding film pattern and the light-semitransmissive film 2 is good, even when a fine pattern having a pattern dimension of less than, for example, 80 nm is to be formed, the falling of the light shielding film pattern may be suppressed more effectively.

From the above description, it is preferred that the lower layer 31 of the light shielding film 3 have the content of oxygen of 20 at % or more and less than 30 at %.

Moreover, in the mask blank 10 according to the first embodiment, as described above, the light shielding film 3 has the film configuration in which the light shielding film 3 is dry-etched using the mixture gas of the chlorine gas and the oxygen gas at the low etching rate for the upper layer 33 and the high etching rate for the lower layer 31. In this case, it is preferred that the etching rate of the lower layer 31 be three times the etching rate of the upper layer 33 or more (invention in Configuration 4).

In this manner, with the etching rate of the lower layer 31 being three times the etching rate of the upper layer 33 or more, the etching rate in the depth direction is increased when the etching proceeds from the upper layer 33 to the lower layer 31, and the etching in the depth direction of the lower layer 31 may be completed while suppressing the progress of the side etching in the upper layer 33 in a preferred manner.

A method of adjusting the etching rates of the respective layers of the light shielding film 3 is not particularly limited, but in this invention, it is preferred to adjust the etching rates by varying the compositions of the respective layers forming the light shielding film 3. Basically, the etching rates may be adjusted by adjusting the contents of chromium or the contents of oxygen in the respective layers, but the etching rates of the respective layers may be adjusted by adjusting amount of additive of elements (for example, tin, indium, and molybdenum) capable of increasing the etching rates. Among others, tin is particularly preferred because of having little effect on optical characteristics of a film made of a chromium-based material, and further of being capable of increasing the etching rate in a small amount.

When tin is to be added to the light shielding film 3, tin may be added at least in the lower layer 31 to reduce the time for over etching during the etching of the light shielding film 3, with the result that a disappearance of the hard mask film may be suppressed more effectively. In addition, the time during which the side walls of the upper layer 33 are exposed to the etching gas may be reduced, and hence thinning of the pattern dimensions by the side etching of the upper layer 33 may also be suppressed, with the result that the light shielding film pattern having the excellent dimensional accuracy may be formed.

Moreover, when tin is added also to the upper layer 33, the time required for the etching may be further reduced. However, when tin is excessively added, the progress of the side etching of the upper layer 33 also becomes faster, and hence this is not preferred. When tin is to be added to the upper layer 33, tin may be added so that a proportion of tin to the sum total number of chromium and tin atoms is larger in the lower layer 31 to effectively suppress the side etching in the upper layer and to reduce the etching time required to form the light shielding film pattern.

When a thin film to which tin is added is to be formed in the light shielding film 3, it is preferred that the proportion of tin to the sum total number of chromium and tin atoms be 0.55 or less. When the proportion of tin exceeds 0.55, there is a fear that the optical characteristics of the light shielding film may deviate from a desired value. In addition, a proportion of tin oxide in the film is increased to deteriorate reactivity with an etching gas (specifically, chlorine-based etching gas) for etching the chromium-based thin film, with the result that there is a possibility that the etching rate may be reduced to the contrary. A more preferred proportion of the above-mentioned tin is 0.3 or less.

Meanwhile, even a small amount of additive of tin exerts an appropriate effect, but a clear effect is observed at a proportion of the above-mentioned tin of 0.01 or more, and preferably 0.1 or more.

In this invention, the lower layer of the light shielding film may have the structure in which the bottom layer and the intermediate layer are laminated in the stated order from the light-semitransmissive film side (invention in Configuration 5). In other words, the light shielding film has the laminated structure of the bottom layer, the intermediate layer, and the upper layer.

Figure 2:
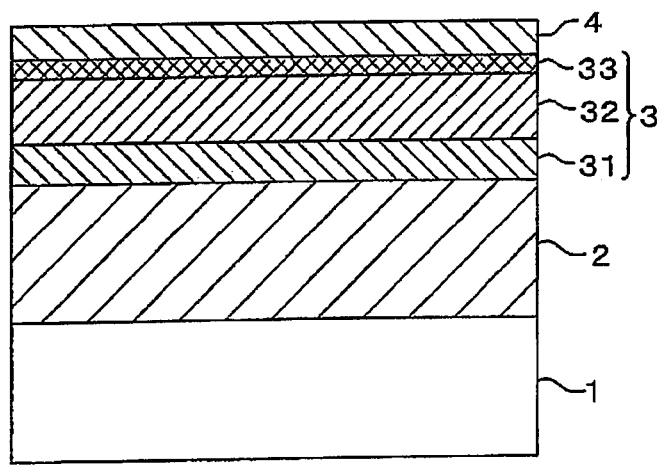
FIG. 2 is a schematic cross-sectional view of a mask blank according to a second embodiment of this invention.

FIG. 2 is a schematic cross-sectional view for illustrating such mask blank according to a second embodiment of this invention.

As illustrated in FIG. 2, a mask blank 20 according to the second embodiment of this invention has the structure in which, similarly to the first embodiment described above, a light-semitransmissive film 2, a light shielding film 3, and a hard mask film 4 are laminated in the stated order on a transparent substrate 1. The light shielding film 3 has the laminated structure of a bottom layer 31, an intermediate layer 32, and an upper layer 33.

As in the second embodiment, with the lower layer having the structure in which the bottom layer 31 and the intermediate layer 32 are laminated in the stated order from the light-semitransmissive film 2 side, the intermediate layer 32 is formed between the upper layer 33 and the bottom layer 31 of the light shielding film 3 so that the light shielding film has the three-layer structure. As a result, for example, contents of chromium in the respective layers may be adjusted to control the etching rate of the light shielding film in three stages. For example, when the content of chromium in the intermediate layer 32 is adjusted to be between the contents of chromium of the upper layer 33 and the bottom layer 31, that is, when the intermediate layer 32 has the content of chromium that is lower than that of the upper layer 33 and higher than that of the bottom layer 31, formation of a step due to a difference in degree of progress of side etching in side walls of a pattern of the light shielding film 3 may be suppressed. Consequently, a cross-sectional shape of the pattern may be further improved as compared to the light shielding film having such two-layer structure as in the first embodiment.

In the above-mentioned second embodiment, it is preferred that the etching rate of the bottom layer 31 be three times the etching rate of the upper layer 33 or more (invention of Configuration 6).

In the light shielding film 3 having the three-layer structure, with the etching rate of the bottom layer 31 being three times the etching rate of the upper layer 33 or more, the side wall portion of the pattern in the upper layer 33 is hardly etched during the etching of the bottom layer 31. Thus, the etching in a depth direction of the bottom layer 31 may be completed while suppressing the progress of the side etching in the upper layer 33.

Further, in the above-mentioned second embodiment, it is preferred that the etching rate of the bottom layer 31 be higher than and two times the etching rate of the intermediate layer 32 or less (invention of Configuration 7).

For example, in a case where an etching rate in the bottom layer 31 is relatively higher than that in the intermediate layer 32, when the etching proceeds from the intermediate layer 32 to the bottom layer 31, the etching rate in the depth direction is increased, but with the etching rate of the bottom layer 31 being two times the etching rate of the intermediate layer 32 or less as in the above-mentioned configuration, the etching in the bottom layer 31 and necessary over etching are completed during the etching of the bottom layer 31 before the side etching proceeds more in the intermediate layer 32, and hence formation of a step may be suppressed especially at the interface of the side walls of the pattern between the intermediate layer 32 and the bottom layer 31.

Moreover, it is preferred that the etching rate of the bottom layer 31 be high because the time for over etching may be reduced. Meanwhile, when the etching rate of the bottom layer 31 is too high, the side wall portion of the pattern in the bottom layer portion is deeply eroded by an etching gas, and there is a risk of reducing a contact area between the light-semitransmissive film and the light shielding film pattern. When the etching rate of the bottom layer 31 is in the above-mentioned range, the erosion of the side walls of the pattern in the bottom layer 31 may also be suppressed while reducing the time for over etching.

A method of adjusting the etching rates of the respective layers of the light shielding film having the three-layer structure is similar to that in the case of the light shielding film having the two-layer structure described above.

Moreover, in the first and second embodiments described above, it is preferred that the upper layer 33 of the light shielding film 3 have a thickness of 1.5 nm or more and 8 nm or less (invention in Configuration 8).

When the thickness of the upper layer 33 falls below 1.5 nm, there is an increased risk of the erosion of the side walls of the pattern in the upper layer 33 during the dry etching. Moreover, when the thickness of the upper layer 33 exceeds 8 nm, there arises a fear that etching time for the upper layer 33 may be increased. Therefore, with the upper layer 33 of the light shielding film 3 having the thickness in the above-mentioned range of 1.5 nm or more and 8 nm or less, the good patterning accuracy in the upper layer 33 may be maintained while satisfactorily suppressing the etching time of the upper layer 33. A preferred thickness of the upper layer 33 is 3 nm or more and 8 nm or less.

When the light shielding film 3 has the three-layer structure, it is preferred that the upper layer 33 have a thickness of 1.5 nm or more and 8 nm or less as described above. Moreover, the intermediate layer 32 has a film thickness of preferably 3 nm or more and 50 nm or less, and particularly preferably in a range of 3 nm or more and 40 nm or less. The bottom layer 31 has a film thickness of preferably 10 nm or more and 50 nm or less, and particularly preferably in a range of 20 nm or more and 40 nm or less. With such configuration of the film thicknesses, the step in the side walls of the pattern may be suppressed. In addition, the time required for the over etching may be reduced, and a degradation in dimensional accuracy regarding the side etching of the chromium-based light shielding film may be suppressed.

Moreover, in the first and second embodiments described above, it is preferred that the light shielding film 3 have a total thickness of 35 nm or more and 55 nm or less (invention in Configuration 9).

With the light shielding film 3 having the thickness of 35 nm or more and 55 nm or less, the thickness of the entire light shielding film 3 may be reduced, and the accuracy of patterning the light-semitransmissive film 2 using the pattern of the light shielding film 3 as the mask may be increased.

Moreover, in the first and second embodiments described above, the hard mask film 4 at least contains any one or both of silicon and tantalum, but is preferably formed of a material containing oxygen in addition to silicon and tantalum, in particular (invention of Configuration 10).

The hard mask film 4 needs to be made of a material having high etching selectivity with respect to the light shielding film 3, which is immediately below the hard mask film 4. In particular, a material containing oxygen in addition to silicon or tantalum may be selected for the hard mask film 4 to secure the high etching selectivity with respect to the light shielding film 3, which is made of the chromium-based material, and hence not only the resist film but also the hard mask film 4 may be reduced in thickness. Therefore, accuracy of transferring the resist pattern, which includes the transfer pattern formed on the front surface of the mask blank, to the hard mask film 4 is improved.

Specific examples of the material for forming such hard mask film 4 include silicon oxide ($SiO_2$), silicon oxynitride (SiON), tantalum oxide (TaO), tantalum oxynitride (TaON), tantalum borate (TaBO), and tantalum boron oxynitride (TaBON).

The hard mask film 4 formed of the material containing silicon and oxygen tends to be low in adhesion with the resist film made of the organic-based material, and hence it is preferred to perform hexamethyldisilazane (HMDS) processing on a surface of the hard mask film 4 to improve the adhesion of the surface.

Moreover, in the first and second embodiments described above, the light-semitransmissive film 2 at least contains silicon, but is preferably formed of a material containing silicon and nitrogen, in particular (invention of Configuration 11).

With the material containing silicon and nitrogen being applied to the light-semitransmissive film 2, the etching selectivity with respect to the chromium-based light shielding film 3 may be secured. Alternatively, when the material containing silicon and nitrogen is used, the patterning using the anisotropic fluorine-based gas as the etching gas may be applied. Therefore, the transfer pattern having the excellent pattern accuracy may also be formed in the light-semitransmissive film 2 by the anisotropic etching using as the mask the pattern of the light shielding film 3, to which the pattern shape of the hard mask film 4 has been transferred substantially accurately.

Further, it is preferred that, in the first and second embodiments described above, the light-semitransmissive film 2 and the light shielding film 3 form a laminated structure having a transmittance of 0.2% or less with respect to an ArF excimer laser light (wavelength: 193 nm) (invention of Configuration 12).

As described above, the laminated structure of the light-semitransmissive film 2 and the light shielding film 3 has a transmittance of 0.2% or less with respect to the ArF excimer laser light (wavelength: 193 nm). Thus, the laminated structure has good light shielding property (optical density of 2.7 or more) with respect to the ArF excimer laser light as the exposure light, which is required of the light shielding band, for example, in a preferred manner.

Further, it is preferred that, in the first and second embodiments described above, the light-semitransmissive film 2 and the light shielding film 3 form a laminated structure having a transmittance of 50% or less with respect to light having a wavelength in at least a part of a wavelength region of from 800 nm to 900 nm (invention of Configuration 13).

The resist is not sensitive to light in a near-infrared region having a wavelength of from 800 nm to 900 nm, and hence the light is used for alignment when the mask blank is placed in an exposure apparatus. As in this configuration, the laminated structure of the light-semitransmissive film 2 and the light shielding film 3 has a transmittance of 50% or less with respect to light having a wavelength in at least a part of the wavelength region of from 800 nm to 900 nm. Thus, the laminated structure enables easy placement of the mask blank in the exposure apparatus in a preferred manner.

Moreover, in the first and second embodiments described above, both of the hard mask film 4 and light-semitransmissive film 2 may be patterned by the dry etching using the fluorine-based gas (invention of Configuration 14). Consequently, together with the substantially accurate transfer of the pattern shape of the hard mask film 4, which is immediately above the upper layer 33 of the light shielding film 3, to the upper layer 33, the transfer pattern having the excellent form accuracy of the pattern may be formed in the light-semitransmissive film 2 by the patterning by means of the anisotropic etching using the light shielding film 3 as the mask.

This invention also provides a method of manufacturing a transfer mask using the above-mentioned mask blank according to this invention (invention of Configuration 15).

FIG. 3A to FIG. 3E are schematic cross-sectional views of the mask blank and the like, for illustrating manufacturing steps of the transfer mask using the mask blank 10 according to the first embodiment of this invention or the mask blank 20 according to the second embodiment of this invention, FIG. 3A to FIG. 3E are intended to enhance the understanding of the manufacturing steps, and cross-sectional shapes of the patterns illustrated in FIG. 3A to FIG. 3E do not correctly represent cross-sectional shapes that are actually formed.

Figure 3A:
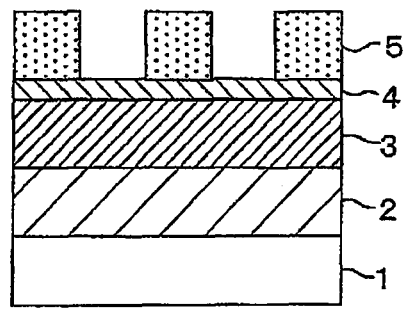
FIG. 3A is a schematic cross-sectional view of the mask blank and the like, for illustrating a manufacturing step of a transfer mask using the mask blank according to this invention.

First, for example, a predetermined resist pattern 5 is formed on the surface of the mask blank 10 (see FIG. 3A). This resist pattern 5 has a desired pattern, which is the final transfer pattern to be formed in the light-semitransmissive film 2. When the mask blank 20 is used, the manufacturing steps are the same.

Next, a hard mask film pattern 4a corresponding to the pattern of the light-semitransmissive film is formed in the hard mask film 4 by the dry etching using the fluorine-based gas, and using as a mask the resist pattern 5, which is formed on the hard mask film 4 of the mask blank 10 and has the above-mentioned light-semitransmissive film pattern (see FIG. 36).

Next, a light shielding film pattern 3a corresponding to the light-semitransmissive film pattern is formed in the light shielding film 3 having the laminate structure by the dry etching using the mixture gas of the chlorine gas and the oxygen gas, and using as a mask the hard mask film pattern 4a formed as described above (see FIG. 3C).

Next, a light-semitransmissive film pattern 2a is formed in the light-semitransmissive film 2 by the dry etching using the fluorine-based gas, and using as a mask the light shielding film pattern 3a formed as described above (see FIG. 3D). In the etching step of the light-semitransmissive film 2, the hard mask film pattern 4a that is exposed on the surface is removed.

Next, a resist film is applied on the entire surface of the light shielding film pattern 3a, and a resist pattern (not illustrated), which corresponds to the light shielding pattern (for example, light shielding band pattern) to be formed in the light shielding film, is formed through predetermined exposure and development processing. Then, a predetermined light shielding pattern 3b is formed in the light-semitransmissive film pattern 2a by the dry etching using the mixture gas of the chlorine gas and the oxygen gas, and using the resist pattern as a mask. Finally, the remaining resist pattern is removed to complete a transfer mask (for example, halftone-type phase shift mask) 30 (see FIG. 3E).

As is apparent from the above description, the transfer mask may be manufactured following the above-mentioned manufacturing steps using the mask blank 10 according to the first embodiment of this invention or the mask blank 20 according to the second embodiment of this invention to obtain the transfer mask in which even the fine transfer pattern is formed with high pattern accuracy. More specifically, according to the mask blank 10 or the mask blank 20 of the embodiments of this invention, the upper layer 33 of the light shielding film 3 has the high content of chromium (is chromium-rich) and the low content of oxygen, and hence has the low etching rate, with the result that the pattern of the upper layer 33 is less susceptible to the side etching. Therefore, there can be formed the pattern of the light shielding film 3 including the upper layer 33 to which the shape of the transfer pattern, which is formed in the resist film or the hard mask film 4, is transferred substantially accurately. As a result, when the light-semitransmissive film 2 is patterned using the light shielding film pattern as the mask, the transfer pattern having the excellent pattern accuracy may also be formed in the light-semitransmissive film 2.

As described above, even when a fine pattern is formed, there is no such problem as the falling of the light shielding film pattern, and the pattern of the light-semitransmissive film 2 may also be formed with high pattern accuracy. As a result, there may be obtained a transfer mask in which the fine pattern is formed with the high pattern accuracy.

Moreover, according to a method of manufacturing a semiconductor device, which includes a step of patterning and transferring the transfer pattern of the transfer mask to the semiconductor substrate by a lithography method using the transfer mask which has been manufactured by the above-mentioned method of manufacturing the transfer mask according to this invention and in which the above-mentioned fine pattern is formed with the high pattern accuracy, a high-quality semiconductor device with excellent pattern accuracy may be obtained.

EXAMPLE

Now, the present invention will be described in more detail by way of Examples.

Example 1

Example 1 according to this invention relates to a mask blank for use in manufacturing of a halftone-type phase shift mask using the ArF excimer laser having the wavelength of 193 nm as the exposure light, and corresponds to the first embodiment described above.

The mask blank used in this Example has the structure in which the light-semitransmissive film 2, the light shielding film 3 having the two-layer laminated structure, and the hard mask film 4 are laminated in the stated order on the transparent substrate (glass substrate) 1 as illustrated in FIG. 1. This mask blank was manufactured as follows.

As the glass substrate, a synthetic quartz substrate (having a size of about 152 mm by about 152 mm and a thickness of 6.35 mm) was prepared.

Then, the above-mentioned synthetic quartz substrate was placed in a sheet-type DC sputtering apparatus, and a MoSiN light-semitransmissive film (phase shift film) made of molybdenum, silicon, and nitrogen was formed to have a thickness of 69 nm on the synthetic quartz substrate by reactive sputtering (DC sputtering) using a mixed sintered target of molybdenum (Mo) and silicon (Si) (Mo:Si=12 at %:88 at %), and using as a sputtering gas a mixture gas of argon (Ar), nitrogen ($N_2$), and helium (He) (at a ratio of flow rates of Ar:$N_2$:He=8:72:100 and a pressure of 0.2 Pa). A composition of the formed MoSiN film was Mo:Si:N=4.1: 35.6:60.3 (at % ratio). The composition was measured by XPS.

Next, the substrate was taken out of the sputtering apparatus, and heating processing in the air was performed on the light-semitransmissive film on the above-mentioned synthetic quartz substrate. This heating processing was performed at 450° C. for 30 minutes. On the light-semitransmissive film after this heating processing, when a transmittance and a phase shift amount at the wavelength (193 nm) of the ArF excimer laser were measured using a phase shift amount measurement apparatus, the transmittance was 6.44%, and the phase shift amount was 174.3 degrees.

Next, the substrate on which the above-mentioned light-semitransmissive film had been formed was put in the sputtering apparatus again, and a light shielding film having a laminated structure of a lower layer made of a CrOCN film and an upper layer made of a CrN film was formed on the above-mentioned light-semitransmissive film. Specifically, reactive sputtering was performed in a mixture gas atmosphere of argon (Ar), carbon dioxide ($CO_2$), nitrogen ($N_2$), and helium (He) (at a ratio of flow rates of Ar:$CO_2$:$N_2$: He=20:24:22:30 and a pressure of 0.3 Pa) using a target made of chromium so that the lower layer of the light shielding film made of the CrOCN film was formed to have a thickness of 47 nm on the above-mentioned light-semitransmissive film. Subsequently, reactive sputtering was performed in a mixture gas atmosphere of argon (Ar) and nitrogen ($N_2$) (at a ratio of flow rates of Ar:$N_2$=25:5 and a pressure of 0.3 Pa) similarly using the target made of chromium so that the upper layer of the light shielding film made of the CrN film was formed to have a thickness of 5 nm on the above-mentioned lower layer.

A composition of the formed CrOCN film as the lower layer of the light shielding film was Cr:O:C:N=49.2:23.8: 13.0:14.0 (at % ratio) and a composition of the CrN film as the upper layer of the light shielding film was Cr:N=76.2: 23.8 (at % ratio). Those compositions were measured by XPS.

Next, a hard mask film made of a SiON film was formed on the above-mentioned light shielding film. Specifically, reactive sputtering was performed in a mixture gas atmosphere of argon (Ar), nitrogen monoxide (NO), and helium (He) (at a ratio of flow rates of Ar:NO:He=8:29:32 and a pressure of 0.3 Pa) using a target of silicon so that the hard mask film made of the SiON film was formed to have a thickness of 15 nm on the above-mentioned light shielding film. A composition of the formed SiON film was Si:O: N=37:44:19 (at % ratio). The composition was measured by XPS.

An optical density of the above-mentioned laminated structure of the light-semitransmissive film and the light shielding film was 3.0 or more (transmittance of 0.1% or less) at the wavelength (193 nm) of the ArF excimer laser. Moreover, a transmittance at a wavelength of 880 nm (wavelength used for alignment of the substrate to be loaded in an exposure apparatus) was 50% or less.

The mask blank according to this Example was manufactured as described above.

Next, a halftone-type phase shift mask was manufactured using the mask blank and following the above-mentioned manufacturing steps illustrated in FIG. 3. Reference numerals in the following description correspond to the reference numerals in FIG. 1 and FIG. 3.

First, HMDS processing was performed on an upper surface of the mask blank 10. A chemical amplification resist for electron beam lithography (PRL 009 manufactured by FUJIFILM Electronic Materials Co., Ltd.) was applied by spin coating, and predetermined baking processing was performed so that a resist film was formed to have a film thickness of 150 nm.

Next, a predetermined device pattern (pattern corresponding to a phase shift pattern to be formed in the light-semitransmissive film 2 (phase shift layer) and including lines and spaces) was drawn on the above-mentioned resist film using an electron beam lithography apparatus. Then, the resist film was developed to form a resist pattern 5 (see FIG. 3A).

Figure 3B:
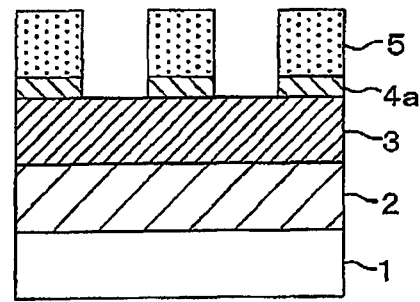
FIG. 3B is a schematic cross-sectional view of the mask blank and the like, for illustrating a manufacturing step of the transfer mask using the mask blank according to this invention.

Next, the hard mask film 4 was dry-etched using the resist pattern 5 as the mask to form the hard mask film pattern 4a (see FIG. 3B). A fluorine-based gas ($SF_6$) was used as a dry etching gas.

Figure 3C:
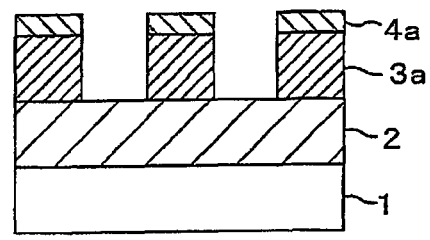
FIG. 3C is a schematic cross-sectional view of the mask blank and the like, for illustrating a manufacturing step of the transfer mask using the mask blank according to this invention.

After removing the resist pattern 5, the light shielding film 3 made of the laminated film of the upper layer and the lower layer was dry-etched successively using the hard mask film pattern 4a as a mask to form the light shielding film pattern 3a (see FIG. 3C). A mixture gas of $Cl_2$ and $O_2$ ($Cl_2$:$O_2$=8:1 (ratio of flow rates)) was used as a dry etching gas. The etching rate of the light shielding film 3 was 2.9 Å/sec for the upper layer and 5.1 Å/sec for the lower layer.

Subsequently, the light-semitransmissive film 2 was dry-etched using the light shielding film pattern 3a as a mask to form the light-semitransmissive film pattern 2a (phase shift film pattern) (see FIG. 3D). A fluorine-based gas ($SF_6$) was used as a dry etching gas. In the etching step of the light-semitransmissive film 2, the hard mask film pattern 4a that is exposed on the surface was removed.

Figure 3D:
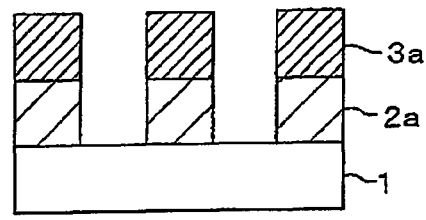
FIG. 3D is a schematic cross-sectional view of the mask blank and the like, for illustrating a manufacturing step of the transfer mask using the mask blank according to this invention.

Next, the above-mentioned resist film was formed again on the entire surface of the substrate in the above-mentioned state of FIG. 3D by spin coating. A predetermined device pattern (for example, pattern corresponding to light shielding band pattern) was drawn using the electron beam lithography apparatus, and was then developed to form the predetermined resist pattern. Subsequently, the exposed light shielding film pattern 3a was etched using the resist pattern as a mask to remove, for example, the light shielding film pattern 3a in a transfer pattern forming region, and a light shielding band pattern 3b was formed in a peripheral portion of the transfer pattern forming region. A mixture gas of $Cl_2$ and $O_2$ ($Cl_2$:$O_2$=8:1 (ratio of flow rates)) was used as a dry etching gas in this case.

Figure 3E:
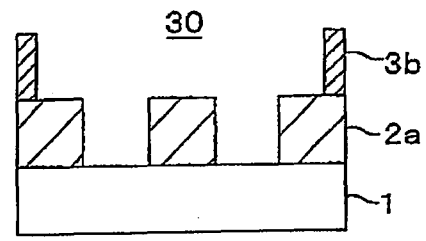
FIG. 3E is a schematic cross-sectional view of the mask blank and the like, for illustrating a manufacturing step of the transfer mask using the mask blank according to this invention.

Finally, the remaining resist pattern was removed to manufacture the halftone-type phase shift mask 30 (see FIG. 3E).

[Evaluation of Light Shielding Film Pattern]

Figure 4:
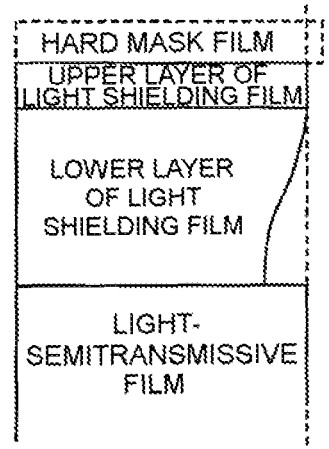
FIG. 4 is a cross-sectional view for illustrating a cross-sectional shape of a light shielding film pattern in Example 1 of this invention.

When a cross-sectional shape of the light shielding film pattern was checked after the above-mentioned step of etching the light-semitransmissive film 2 (step in FIG. 3D) was ended, the cross-sectional shape as illustrated in FIG. 4 was observed. More specifically, although the side walls of the upper layer of the light shielding film is slightly eroded from the pattern of the hard mask film, the form defined by the hard mask film pattern may be obtained, and the hard mask film pattern was transferred accurately. The hard mask film pattern 4a had been removed at this point in time, and hence the state before the removal is illustrated by the broken line in FIG. 4.

Moreover, as a result of reducing a line width of a line-and-space pattern, which was formed in the above-mentioned resist film, in steps of 10 nm from 200 nm, and checking a formed state of the light shielding film pattern, the pattern was able to be formed up to a 50 nm width.

[Evaluation of Light-Semitransmissive Film Pattern]

When the light-semitransmissive film pattern, which was formed by the dry etching using the above-mentioned light shielding film pattern as the mask, was evaluated, as apparent from FIG. 4, the shape defined by the pattern of the upper layer of the light shielding film was able to be obtained, and the light-semitransmissive film pattern with an excellent CD characteristic was able to be formed. In other words, even with the fine pattern, the transfer pattern was able to be formed with excellent pattern accuracy and a small divergence from the hard mask film pattern.

Example 2

Example 2 according to this invention relates to a mask blank for use in manufacturing of a halftone-type phase shift mask using the ArF excimer laser having the wavelength of 193 nm as the exposure light, and corresponds to the second embodiment described above.

The mask blank used in this Example has the structure in which the light-semitransmissive film 2, the light shielding film 3 having the three-layer laminated structure, and the hard mask film 4 are laminated in the stated order on the transparent substrate (glass substrate) 1 as illustrated in FIG. 2. This mask blank was manufactured as follows.

As the glass substrate, a synthetic quartz substrate (having a size of about 152 mm by about 152 mm and a thickness of 6.35 mm) was prepared.

Then, the above-mentioned synthetic quartz substrate was placed in a sheet-type DC sputtering apparatus, and a MoSiN light-semitransmissive film (phase shift film) made of molybdenum, silicon, and nitrogen was formed to have a thickness of 69 nm on the synthetic quartz substrate by reactive sputtering (DC sputtering) using a mixed sintered target of molybdenum (Mo) and silicon (Si) (Mo:Si=12 at %:88 at %), and using as a sputtering gas a mixture gas of argon (Ar), nitrogen ($N_2$), and helium (He) (at a ratio of flow rates of Ar:$N_2$:He=8:72:100 and a pressure of 0.2 Pa). A composition of the formed MoSiN film was Mo:Si:N=4.1:35.6:60.3 (at % ratio). The composition was measured by XPS.

Next, the substrate was taken out of the sputtering apparatus, and heating processing in the air was performed on the light-semitransmissive film on the above-mentioned synthetic quartz substrate. This heating processing was performed at 450° C. for 30 minutes. On the light-semitransmissive film after this heating processing, when a transmittance and a phase shift amount at the wavelength (193 nm) of the ArF excimer laser were measured using a phase shift amount measurement apparatus, the transmittance was 6.44%, and the phase shift amount was 174.3 degrees.

Next, the substrate on which the above-mentioned light-semitransmissive film had been formed was put in the sputtering apparatus again, and a light shielding film having a laminated structure of a lower layer (bottom layer) made of a CrOCN film, an intermediate layer made of a CrOCN film, and an upper layer made of a CrN film was formed on the above-mentioned light-semitransmissive film. Specifically, reactive sputtering was performed in a mixture gas atmosphere of argon (Ar), carbon dioxide ($CO_2$), nitrogen ($N_2$), and helium (He) (at a ratio of flow rates of Ar:$CO_2$:$N_2$:He=20:24:22:30 and a pressure of 0.3 Pa) using a target made of chromium so that the lower layer of the light shielding film made of the CrOCN film was formed to have a thickness of 15 nm on the above-mentioned light-semitransmissive film. Subsequently, reactive sputtering was performed in a mixture gas atmosphere of argon (Ar), carbon dioxide ($CO_2$), nitrogen ($N_2$), and helium (He) (at a ratio of flow rates of Ar$CO_2$:$N_2$:He=20:25:13:30 and a pressure of 0.3 Pa) similarly using the target made of chromium so that the intermediate layer of the light shielding film made of the CrOCN film was formed to have a thickness of 27 nm on the above-mentioned lower layer. Then reactive sputtering was performed in a mixture gas atmosphere of argon (Ar) and nitrogen ($N_2$) (at a ratio of flow rates of Ar:$N_2$=25:5 and a pressure of 0.3 Pa) similarly using the target made of chromium so that the upper layer of the light shielding film made of the CrN film was formed to have a thickness of 3.7 nm on the above-mentioned intermediate layer.

A composition of the formed CrOCN film as the lower layer of the light shielding film was Cr:O:C:N=49.2:23.8:13.0:14.0 (at % ratio). Moreover, a composition of the CrOCN film as the intermediate layer of the light shielding film was Cr:O:C:N=55.2:22:11.6:11.1 (at % ratio), and a composition of the CrN film as the upper layer of the light shielding film was Cr:N=76.2:23.8 (at % ratio). Those compositions were measured by XPS.

Next, a hard mask film made of a SiON film was formed on the above-mentioned light shielding film. Specifically, reactive sputtering was performed in a mixture gas atmosphere of argon (Ar), nitrogen monoxide (NO), and helium (He) (at a ratio of flow rates of Ar:NO:He=8:29:32 and a pressure of 0.3 Pa) using a target of silicon so that the hard mask film made of the SiON film was formed to have a thickness of 15 nm on the above-mentioned light shielding film. A composition of the formed SiON film was Si:O:N=37:44:19 (at % ratio). The composition was measured by XPS.

An optical density of the above-mentioned laminate structure of the light-semitransmissive film and the light shielding film was 3.0 or more (transmittance of 0.1% or less) at the wavelength (193 nm) of the ArF excimer laser. Moreover, a transmittance at a wavelength of 880 nm (wavelength used for alignment of the substrate to be loaded in an exposure apparatus) was 50% or less.

The mask blank 20 according to this Example was manufactured as described above.

Next, a halftone-type phase shift mask was manufactured using the mask blank and following the above-mentioned manufacturing steps illustrated in FIG. 3A to FIG. 3E.

Reference numerals in the following description correspond to the reference numerals in FIG. 2 and FIG. 3A to FIG. 3E.

First, HMDS processing was performed on an upper surface of the mask blank 20. A chemical amplification resist for electron beam lithography (PRL 009 manufactured by FUJIFILM Electronic Materials Co., Ltd.) was applied by spin coating, and predetermined baking processing was performed so that a resist film was formed to have a film thickness of 150 nm.

Next, a predetermined device pattern (pattern corresponding to a phase shift pattern to be formed in the light-semitransmissive film 2 (phase shift layer) and including lines and spaces) was drawn on the above-mentioned resist film using an electron beam lithography apparatus. Then, the resist film was developed to form a resist pattern 5 (see FIG. 3A).

Next, the hard mask film 4 was dry-etched using the resist pattern 5 as the mask to form the hard mask film pattern 4a (see FIG. 3B). A fluorine-based gas ($SF_6$) was used as a dry etching gas.

After removing the resist pattern 5, the light shielding film 3 made of the laminated film of the upper layer, the intermediate layer, and the lower layer was dry-etched successively using the hard mask film pattern 4a as a mask to form the light shielding film pattern 3a (see FIG. 3C). A mixture gas of $Cl_2$ and $O_2$ ($Cl_2:O_2$=8:1 (ratio of flow rates)) was used as a dry etching gas. The etching rate of the light shielding film 3 was 2.9 Å/sec for the upper layer, 5.1 Å/sec for the intermediate layer, and 9.1 Å/sec for the lower layer.

Subsequently, the light-semitransmissive film 2 was dry-etched using the light shielding film pattern 3a as a mask to form the light-semitransmissive film pattern 2a (phase shift film pattern) (see FIG. 3D). A fluorine-based gas ($SF_6$) was used as a dry etching gas. In the etching step of the light-semitransmissive film 2, the hard mask film pattern 4a that is exposed on the surface was removed.

Next, the above-mentioned resist film was formed again on the entire surface of the substrate in the above-mentioned state of FIG. 3D by spin coating. A predetermined device pattern (for example, pattern corresponding to light shielding band pattern) was drawn using the electron beam lithography apparatus, and was then developed to form the predetermined resist pattern. Subsequently, the exposed light shielding film pattern 3a was etched using the resist pattern as a mask to remove, for example, the light shielding film pattern 3a in a transfer pattern forming region, and a light shielding band pattern 3b was formed in a peripheral portion of the transfer pattern forming region. A mixture gas of $Cl_2$ and $O_2$ ($Cl_2:O_2$=8:1 (ratio of flow rates)) was used as a dry etching gas in this case.

Finally, the remaining resist pattern was removed to manufacture the halftone-type phase shift mask 20 (see FIG. 3E).

[Evaluation of Light Shielding Film Pattern]

Figure 5:
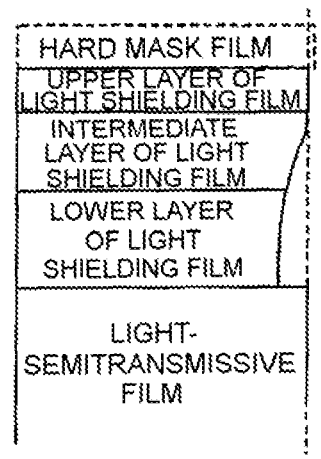
FIG. 5 is a cross-sectional view for illustrating a cross-sectional shape of a light shielding film pattern in Example 2 of this invention.

When a cross-sectional shape of the light shielding film pattern was checked after the above-mentioned step of etching the light-semitransmissive film 2 (step in FIG. 3D) was ended, the cross-sectional shape as illustrated in FIG. 5 was observed. More specifically, although the side walls of the upper layer of the light shielding film is slightly eroded from the pattern of the hard mask film (by an amount smaller than that in Example 1), the form defined by the hard mask film pattern was able to be obtained substantially accurately, and the hard mask film pattern was transferred accurately. This is because, although the etching rate of the lower layer is high, the etching rate of the intermediate layer, which is above the lower layer, is low, and as a result, the erosion of the side walls of the pattern by the etching gas was able to be suppressed effectively. The cross-sectional shape of the light shielding film pattern was better than that in Example 1. The hard mask film pattern 4a had been removed at this point in time, and hence the state before the removal is illustrated by the broken line in FIG. 5.

Moreover, as a result of reducing a line width of a line-and-space pattern, which was formed in the above-mentioned resist film, in steps of 10 nm from 200 nm, and checking a formed state of the light shielding film pattern, the pattern was able to be formed up to a 40 nm width.

[Evaluation of Light-Semitransmissive Film Pattern]

When the light-semitransmissive film pattern, which was formed by the dry etching using the above-mentioned light shielding film pattern as the mask, was evaluated, as apparent from FIG. 5, the shape defined by the pattern of the upper layer of the light shielding film was able to be obtained, and the light-semitransmissive film pattern with an excellent CD characteristic was able to be formed. In other words, even with the fine pattern, the transfer pattern was able to be formed with excellent pattern accuracy and a small divergence from the hard mask film pattern.

Comparative Example

A mask blank was manufactured with the light-semitransmissive film and the hard mask film being films similar to those in Example 1 and with the configuration of the light shielding film being different from that in Example 1. More specifically, the light shielding film in this Comparative Example is a light shielding film having the single-layer structure, and is a thin film having the same composition as the composition of the lower layer of the light shielding film in Example 1, an optical density of 3.0 or more, and a film thickness of 100 nm.

The mask blank in this Comparative Example was used to manufacture a halftone-type phase shift mask in a method similar to that in Example 1.

[Evaluation of Light Shielding Film Pattern]

Figure 6:
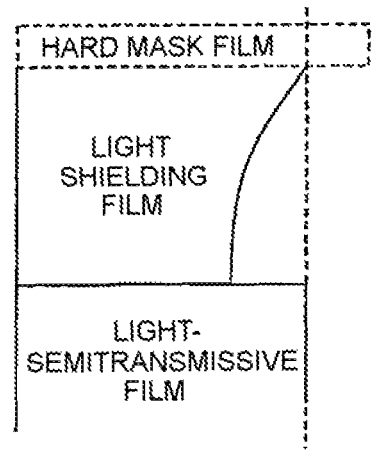
FIG. 6 is a cross-sectional view for illustrating a cross-sectional shape of a light shielding film pattern in Comparative Example of this invention.

When a cross-sectional shape of the light shielding film pattern was checked after the above-mentioned step of patterning the light shielding film 3 (step in FIG. 3C) was ended, the cross-sectional shape as illustrated in FIG. 6 was observed. More specifically, the light shielding film had a shape that was deeply hollowed by the erosion due to the etching in the wall surface of the pattern. Moreover, line widths were thinner than those in the pattern of the hard mask film, and had a tendency toward a large divergence in dimension from the hard mask film pattern.

Moreover, as a result of reducing a line width of a line-and-space pattern, which was formed in the above-mentioned resist film, in steps of 10 nm from 200 nm, and checking a formed state of the light shielding film pattern as in Example 1, the falling of the light shielding film pattern occurred at an 80 nm width.

Therefore, even when such fine pattern as the lines and spaces of, for example, 80 nm or less was to be formed using the mask blank in this Comparative Example, the light shielding film falls, and it is difficult to pattern the light-semitransmissive film, which functions as a final transfer pattern.

The embodiments and Examples of this invention have been described above. However, those embodiments and Examples are merely exemplary, and do not limit the scope of claims. The technology described in the scope of claims encompasses various alterations and modifications to the specific examples exemplified above.

This application is based upon and claims the benefit of priority from Japanese Patent Application No. 2014-070686, filed on Mar. 30, 2014, the disclosure of which is incorporated herein in its entirety by reference.

REFERENCE SIGNS LIST 1 transparent substrate
2 light-semitransmissive film
3 light shielding film
31 lower layer of light shielding film (bottom layer)
32 intermediate layer of light shielding film
33 upper layer of light shielding film
4 hard mask film
5 resist pattern
10, 20 mask blank
30 transfer mask

The invention claimed is:

1. A mask blank having a structure in which a light-semitransmissive film, a light shielding film, and a hard mask film are laminated in the stated order on a transparent substrate,
the light-semitransmissive film at least containing silicon,
the hard mask film being formed in contact with a surface of the light shielding film, and at least containing any one or both of silicon and tantalum,
the light shielding film consisting of a laminated structure of a lower layer and an upper layer,
the light shielding film containing at least chromium,
the light shielding film having a thickness of 35 nm or more and 55 nm or less,
the lower layer having a thickness of 70% or more and 97% or less with respect to a total thickness which is a combined thickness of both the lower layer and the upper layer,
the upper layer having a content of the chromium of 65 at % or more, and a content of oxygen of less than 20 at %,
the lower layer having a content of the chromium of less than 60 at %, and a content of oxygen of 20 at % or more.

2. The mask blank according to claim 1, wherein the lower layer has a content of the chromium of 40 at % or more.

3. The mask blank according to claim 1, wherein the lower layer has a content of the oxygen of 30 at % or less.

4. The mask blank according to claim 1, wherein the lower layer is dry-etched using a mixture gas of a chlorine gas and an oxygen gas at an etching rate that is three times an etching rate at which the upper layer is dry-etched using the mixture gas of the chlorine gas and the oxygen gas or more.

5. The mask blank according to claim 1, wherein the lower layer has a structure in which a bottom layer and an intermediate layer are laminated in the stated order from the light-semitransmissive film side.

6. The mask blank according to claim 5, wherein the bottom layer is dry-etched using a mixture gas of a chlorine gas and an oxygen gas at an etching rate that is three times an etching rate at which the upper layer is dry-etched using the mixture gas of the chlorine gas and the oxygen gas or more.

7. The mask blank according to claim 5, wherein the bottom layer is dry-etched using a mixture gas of a chlorine gas and an oxygen gas at an etching rate that is higher than and two times an etching rate at which the intermediate layer is dry-etched using the mixture gas of the chlorine gas and the oxygen gas or less.

8. The mask blank according to claim 1, wherein the upper layer has a thickness of 1.5 nm or more and 8 nm or less.

9. The mask blank according to claim 1, wherein the hard mask film contains oxygen.

10. The mask blank according to claim 1, wherein the light-semitransmissive film contains silicon and nitrogen.

11. The mask blank according to claim 1, wherein the light-semitransmissive film and the light shielding film form a laminated structure having a transmittance of 0.2% or less with respect to an ArF excimer laser light (wavelength: 193 nm).

12. The mask blank according to claim 1, wherein the light-semitransmissive film and the light shielding film form a laminated structure having a transmittance of 50% or less with respect to light having a wavelength in at least a part of a wavelength region of from 800 nm to 900 nm.

13. The mask blank according to claim 1, wherein the hard mask film and the light-semitransmissive film are patterned by dry etching using a fluorine-based gas.

14. A method of manufacturing a transfer mask using the mask blank of claim 1, the method comprising the steps of:
forming a light-semitransmissive film pattern in the hard mask film by dry etching using a fluorine-based gas and using as a mask a resist film, which is formed on the hard mask film and has the light-semitransmissive film pattern;
forming the light-semitransmissive film pattern in the light shielding film by dry etching using a mixture gas of a chlorine gas and an oxygen gas, and using as a mask the hard mask film, in which the light-semitransmissive film pattern has been formed;
forming the light-semitransmissive film pattern in the light-semitransmissive film by dry etching using a fluorine-based gas and using as a mask the light shielding film, in which the light-semitransmissive film pattern has been formed; and
forming a light shielding pattern in the light shielding film by dry etching using a mixture gas of a chlorine gas and an oxygen gas, and using as a mask a resist film, which is formed on the light shielding film and has a light shielding pattern.

15. A method of manufacturing a semiconductor device, comprising a step of patterning and transferring a transfer pattern of a transfer mask, which is manufactured by the method of manufacturing a transfer mask of claim 14, on a semiconductor substrate by a lithography method using the transfer mask.

16. The mask blank according to claim 1, wherein the hard mask film is made of a material consisting of silicon and one or more elements selected from oxygen, nitrogen, carbon, boron, and hydrogen.

17. The mask blank according to claim 1, wherein the hard mask film is made of any one of $SiO_2$, SiON, and SiOCN.

18. The mask blank according to claim 1, wherein the lower layer has a compressive stress, and the upper layer has a tensile stress.

* * * * *